(12) United States Patent
Deppe et al.

(10) Patent No.: US 7,733,698 B2
(45) Date of Patent: Jun. 8, 2010

(54) MEMORY DEVICE, A NON-VOLATILE SEMICONDUCTOR MEMORY DEVICE AND A METHOD OF FORMING A MEMORY DEVICE

(75) Inventors: Joachim Deppe, Langebrueck/Dresden (DE); Dominik Olligs, Dresden (DE); Christoph Kleint, Dresden (DE); Eike Ruttkowski, Munich (DE); Ricardo Mikalo, Heideblick (DE)

(73) Assignee: Qimonda AG, Munich (DE)

( * ) Notice: Subject to any disclaimer, the term of this patent is extended or adjusted under 35 U.S.C. 154(b) by 383 days.

(21) Appl. No.: 11/688,949

(22) Filed: Mar. 21, 2007

(65) Prior Publication Data
US 2008/0232170 A1 Sep. 25, 2008

(51) Int. Cl.
*G11C 16/04* (2006.01)
(52) U.S. Cl. .................... 365/185.17; 365/185.05

(58) Field of Classification Search .......... 365/185.17, 365/185.05, 63; 257/314
See application file for complete search history.

(56) References Cited

U.S. PATENT DOCUMENTS

| 6,160,297 | A | 12/2000 | Shimizu et al. |
| 6,850,439 | B1 | 2/2005 | Tanaka |
| 6,850,739 | B2 | 2/2005 | Higuchi |
| 7,049,180 | B2 * | 5/2006 | Nomoto et al. ............. 438/129 |
| 7,099,193 | B2 | 8/2006 | Futatsuyama |
| 7,149,112 | B2 | 12/2006 | Kim |
| 2002/0173107 | A1 | 11/2002 | Doong et al. |
| 2004/0059884 | A1 | 3/2004 | Iwasaki |
| 2007/0158688 | A1 * | 7/2007 | Caspary et al. ............. 257/208 |

* cited by examiner

*Primary Examiner*—Vu A Le
(74) *Attorney, Agent, or Firm*—Dicke, Billig & Czaja, PLLC

(57) ABSTRACT

A memory device having an array portion including memory cells, and a peripheral portion including conductive lines is disclosed. In one embodiment, portions of the conductive lines adjoin a surface of a semiconductor carrier.

20 Claims, 15 Drawing Sheets

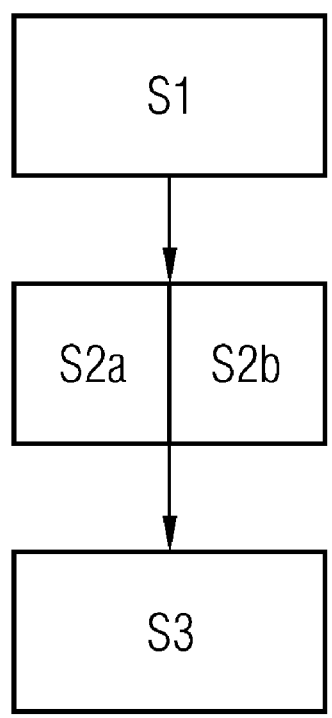
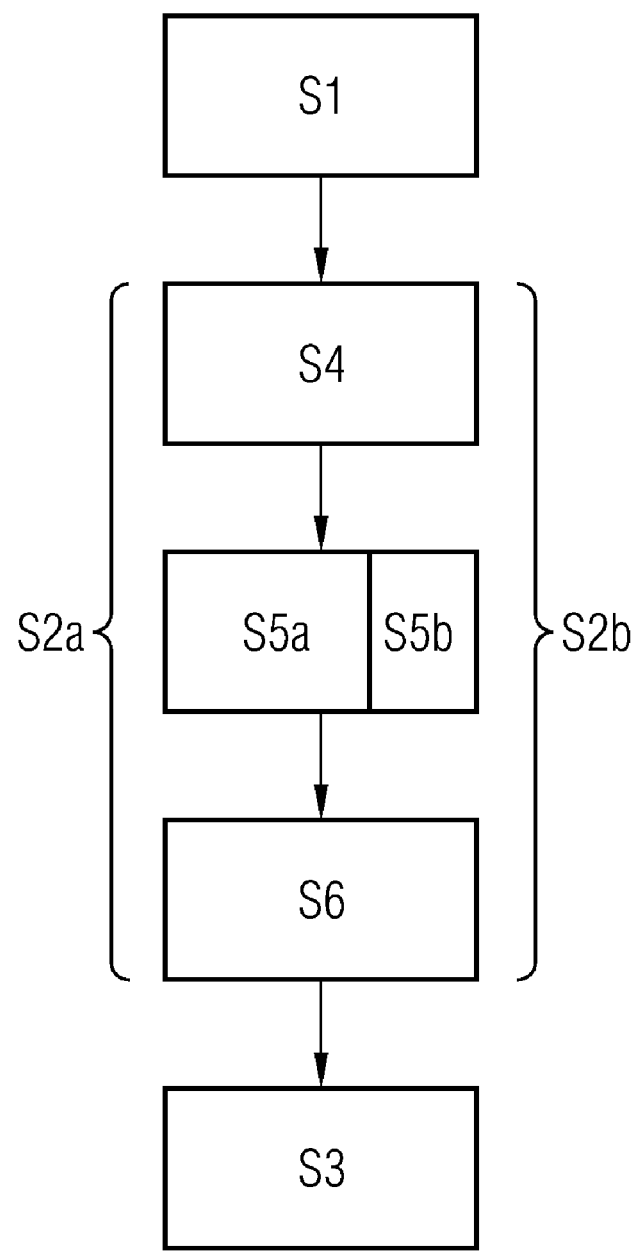
FIG 2C
FIG 2D

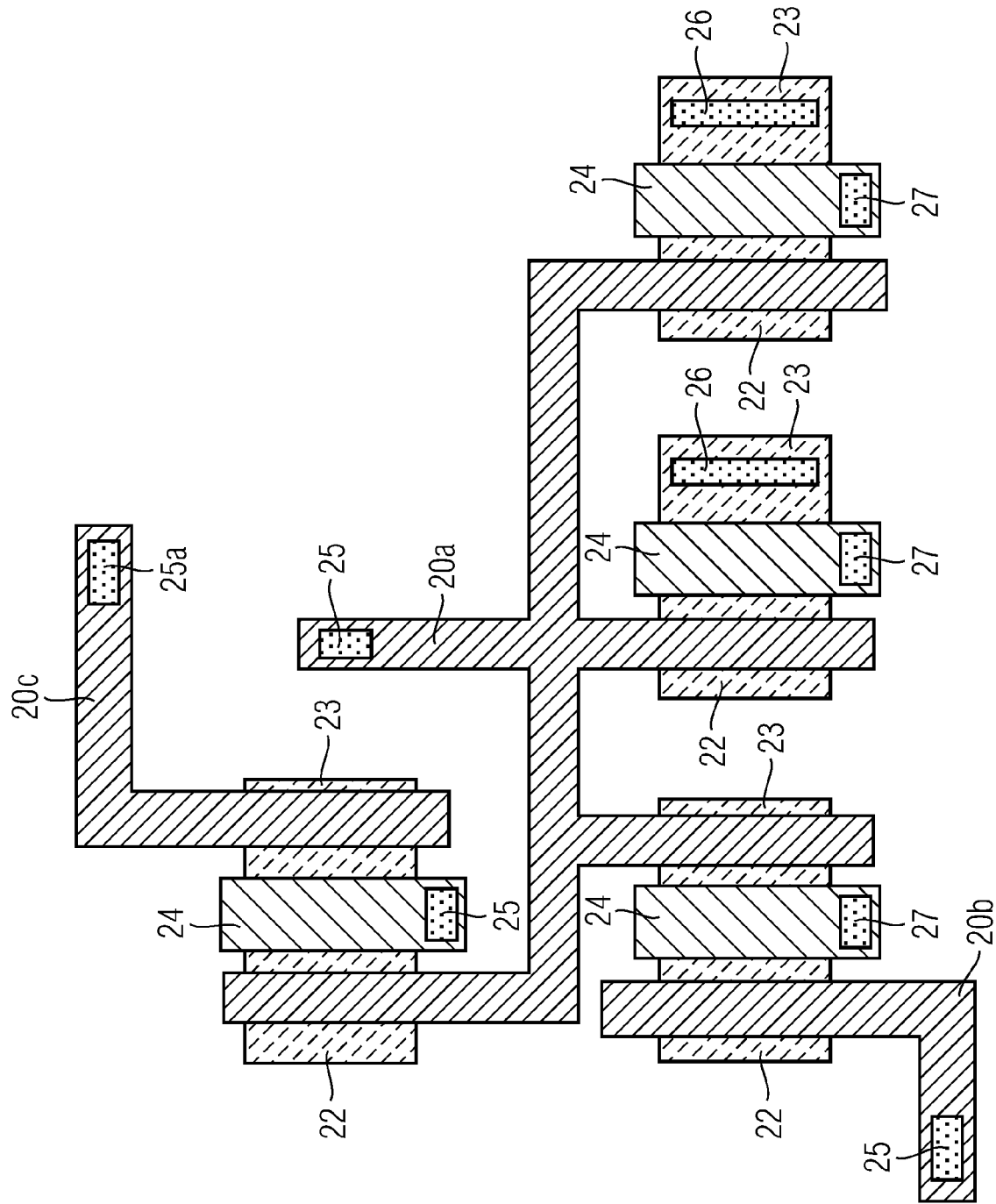

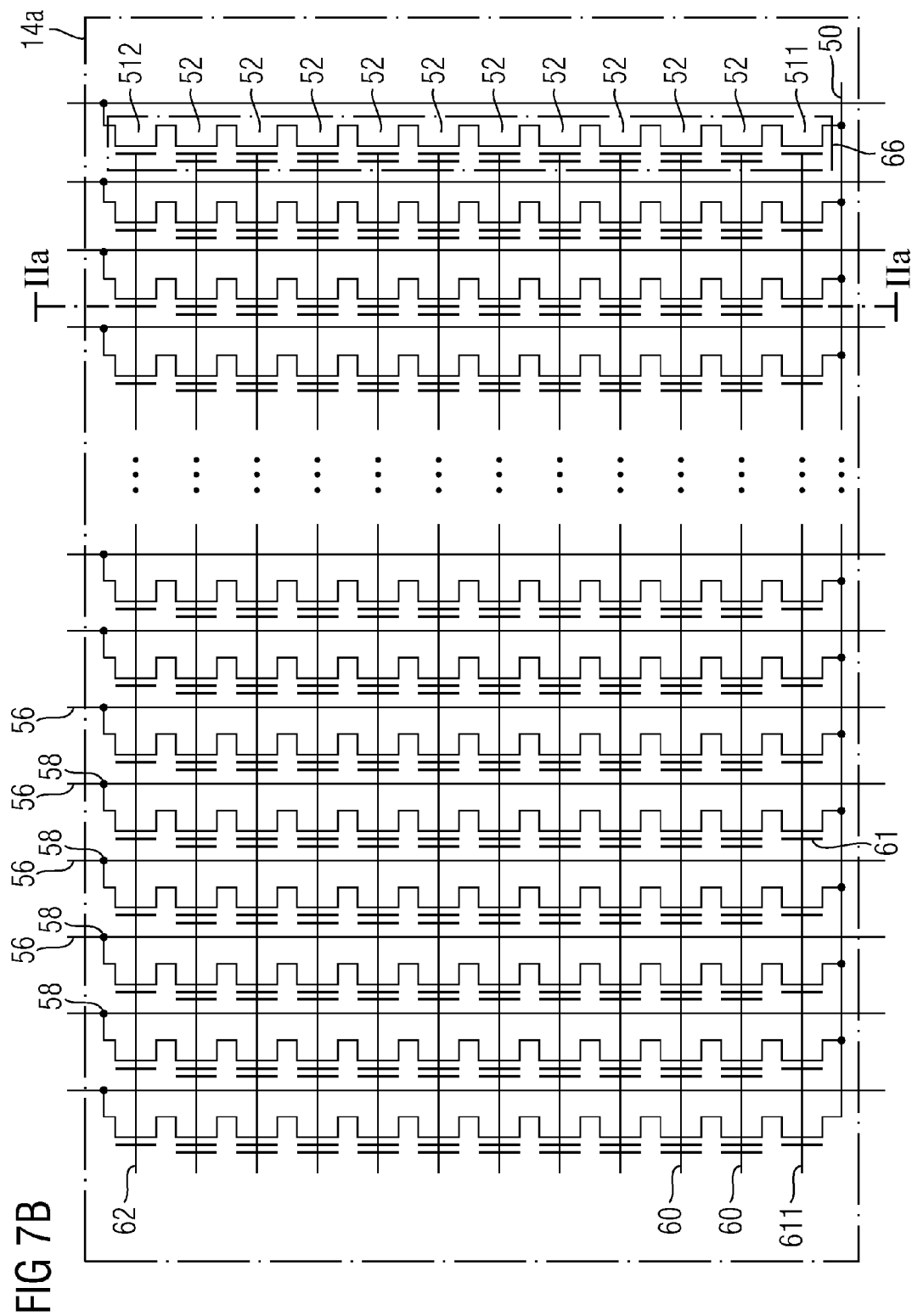

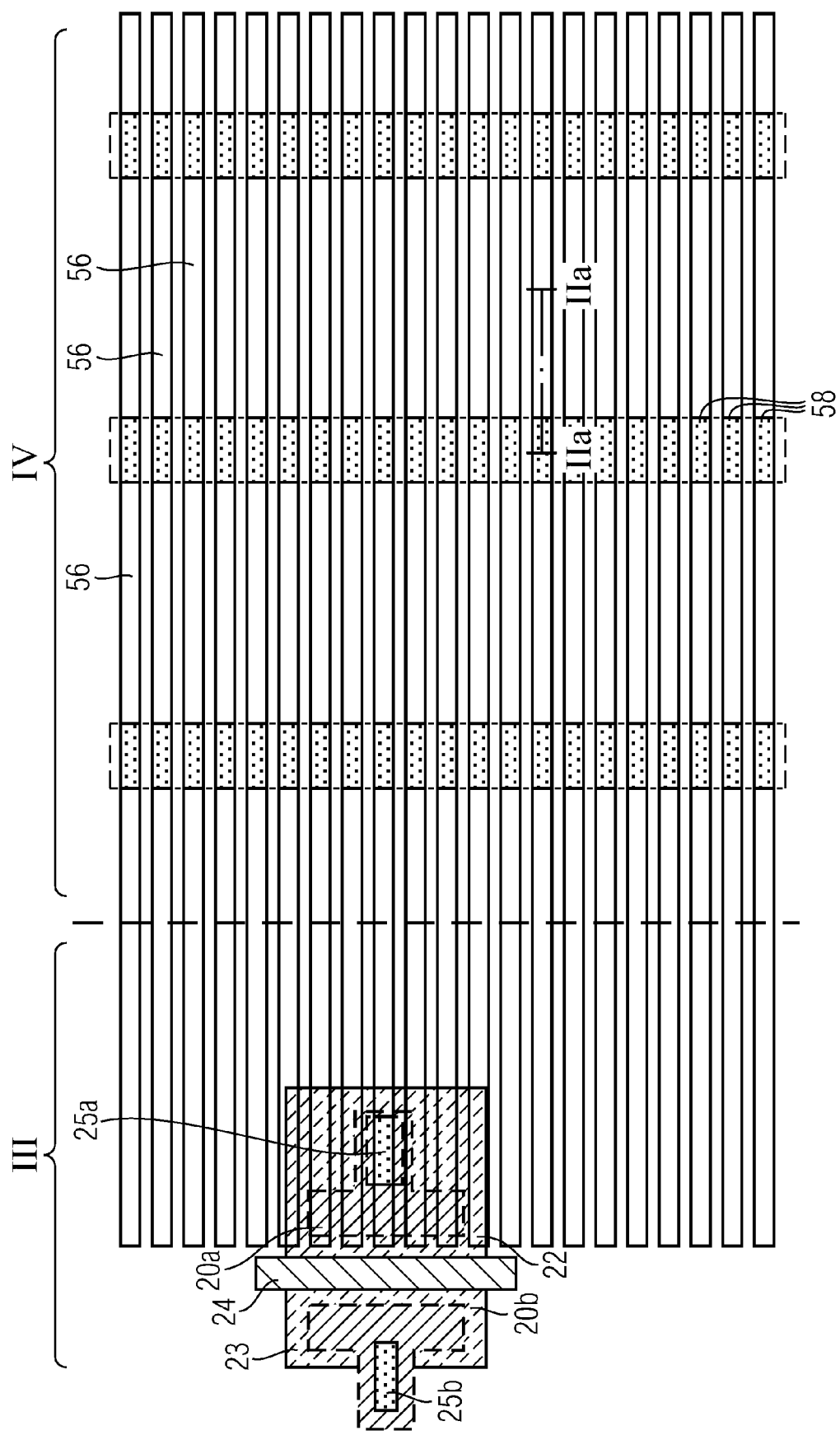

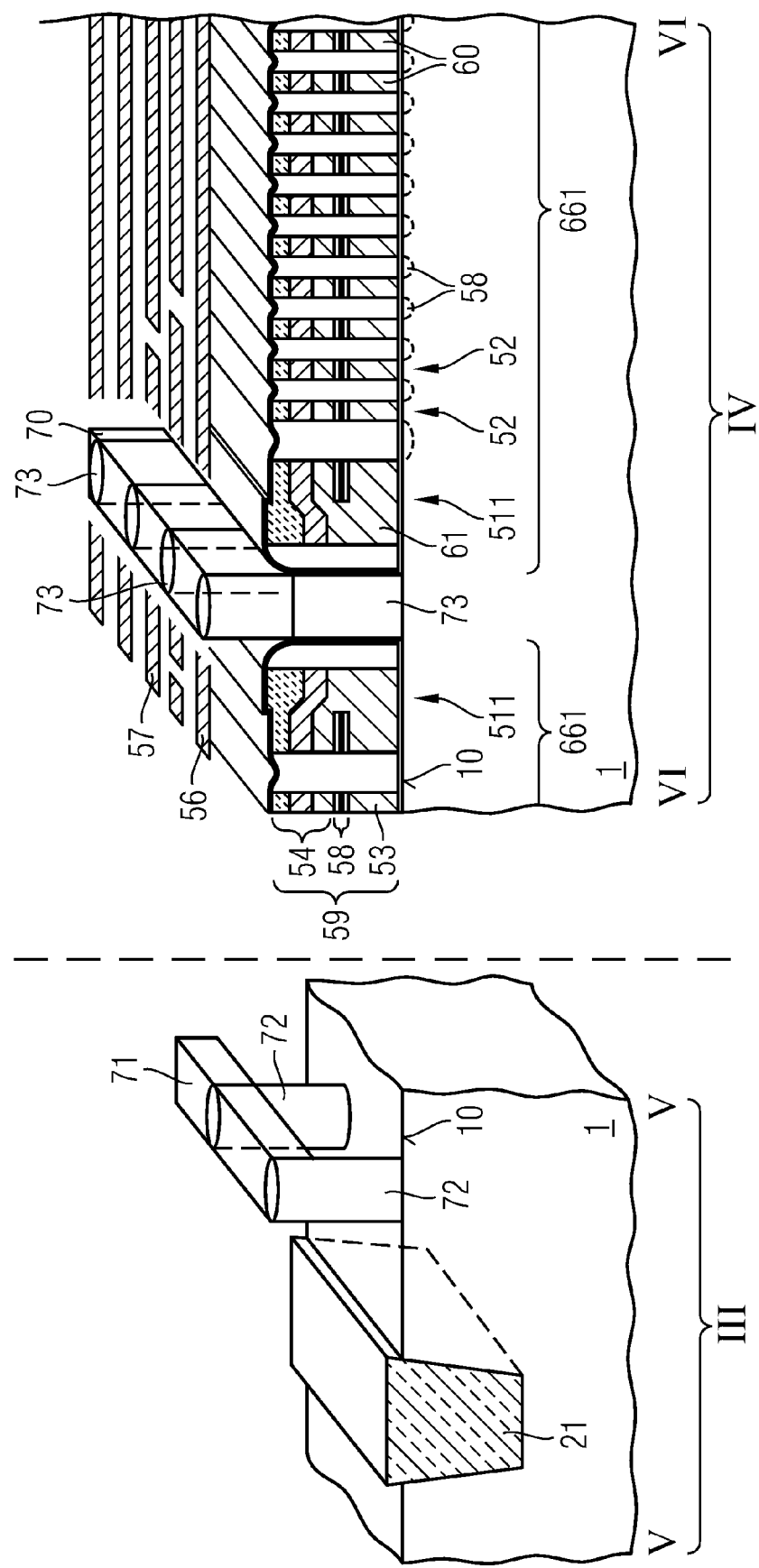

MEMORY DEVICE, A NON-VOLATILE SEMICONDUCTOR MEMORY DEVICE AND A METHOD OF FORMING A MEMORY DEVICE

BACKGROUND

The following description relates to a memory device having an array portion as well as a peripheral portion. Moreover, the description refers to a method of forming such a memory device.

Among the memory devices non-volatile memory devices, such as for example, memory devices employing memory cells, which are based on the floating-gate technology, have gained increased importance during the last years.

As a general aim which is followed with regard to any type of memory device, it is intended to further reduce the size of the memory devices. As a result, a higher packaging density and, a reduced memory device size can be obtained. The efforts to further reduce the size of a memory device are, for example, focused on further reducing the size of the individual memory cells. Nevertheless, the reduction of size is limited amongst others by requirements of the space needed for wiring, for providing contacts to wiring layers and for providing an appropriate metallization layer. Accordingly, concepts are needed by which the space needed for wiring can be reduced without increasing the process complexity.

SUMMARY

A non-volatile semiconductor memory device includes a memory cell array, a source line and a peripheral portion. The memory cell includes NAND strings and each NAND string includes non-volatile memory transistors connected in series. The source line is connected to the NAND string array via select transistors. The peripheral portion includes conductive lines, portions of which adjoin in a surface of a semiconductor carrier.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2C and 2D illustrate exemplary embodiments of a method of manufacturing a memory device;

FIGS. 4A to 4C illustrate exemplary plan views of portions of a memory device, respectively;

FIG. 7B illustrates a equivalent circuit diagram of the memory device illustrated in FIG. 7A;

FIGS. 8A to 8C illustrate plan views of an exemplary memory device, respectively;

FIG. 9 illustrates cross-sectional views of an exemplary memory device according to another embodiment;

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
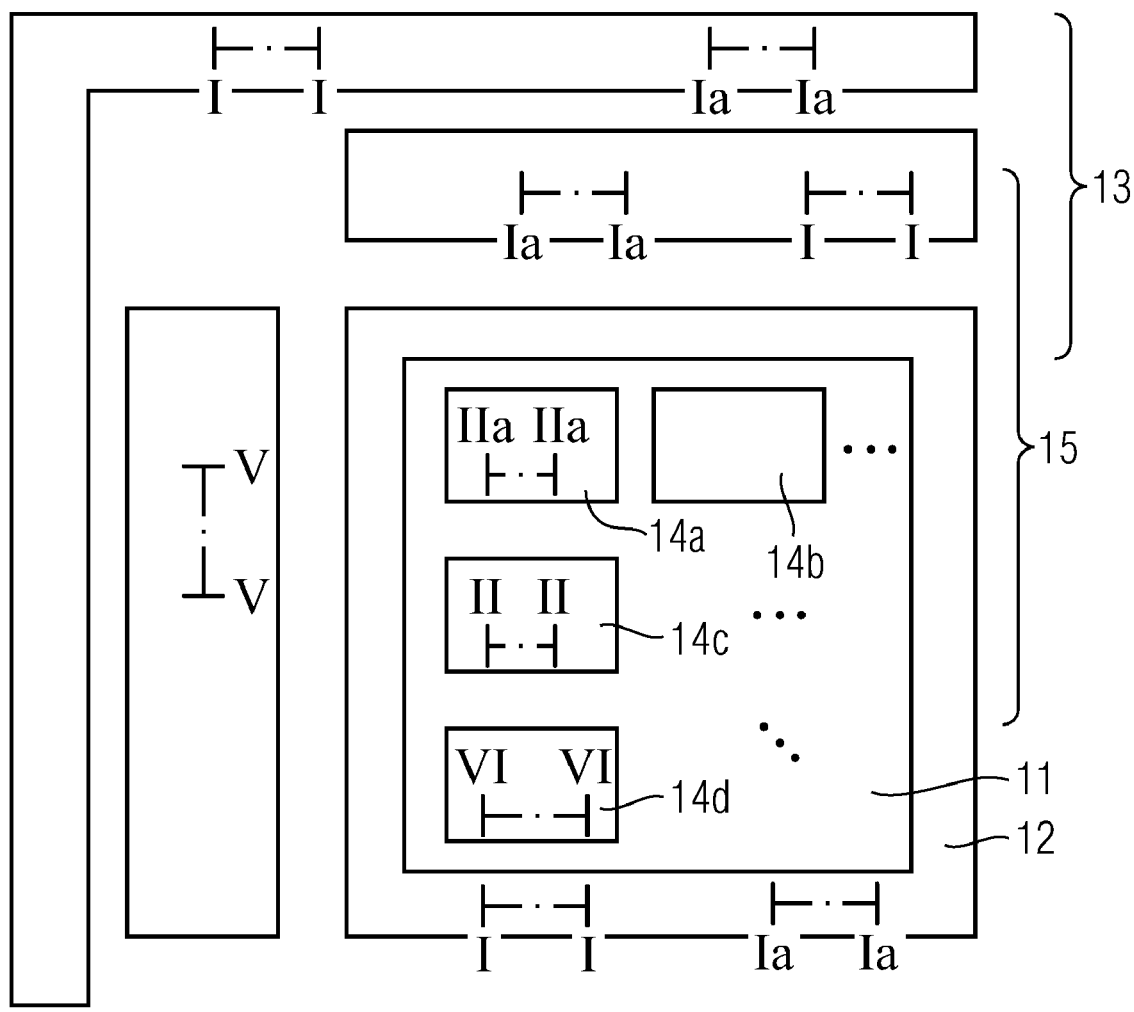
FIG. 1 illustrates a plan view of an exemplary memory device.

FIG. 1 illustrates a plan view of an exemplary memory device according to an embodiment of the present invention. As is illustrated, a memory device 15 may include a memory cell array 11 and a peripheral portion 13. For example, such a memory cell array 11 may include individual blocks 14a, 14b, 14c, 14d . . . in which the individual memory cells are arranged. Furthermore, such a memory cell array 11 may include a plurality of conductive lines which are adapted to program the individual memory cells, and to control a read-out process. For example, the information to be stored in the memory cells may be transmitted via corresponding conductive lines. Moreover, control signals which are used to activate predetermined memory cells may be as well be transmitted via corresponding conductive lines. Usually, these conductive lines of a memory cell array form a dense pattern extending in the X- and the Y-direction. Depending on the type of memory cell array, a fan-out region 12 may be disposed adjacent to the memory cell array 11. For example, such a fan-out region 12 may be used for contacting the individual conductive lines. Usually the conductive lines are arranged at a very small pitch in the memory cell array. Accordingly, it is attempted to relax the requirements with respect to the width of the size of the contact pads present in the fan-out region so as to obtain a reduced contact resistance and in order to relax the overlay requirements of contacts and conductive lines. Moreover, further components may be disposed in the fan-out region 12. The peripheral portion 13 further includes the support portion and the core circuitry in which specific elements necessary for operating a memory device are disposed. For example, any kinds of wordline drivers, sense amplifiers and others may be disposed in the peripheral portion. In the context of the present specification, the peripheral portion refers to the portion of a memory device which lies outside the memory cell array. Accordingly, in the context of the present specification the term "peripheral portion" also refers to the fan-out region 12. In the peripheral portion, for example, transistors and other semiconductor devices may be disposed.

The memory cells which are disposed in the memory cell array 11 may be implemented in an arbitrary manner. For example, they may be memory cells of a non-volatile memory such as storage transistors having charge storing layer such as a floating gate transistor. Nevertheless, any other kind of memory cells may be disposed in the memory cell array 11. Further examples include any type of non-volatile memory cells such as NROM, SONOS and other memory cells, and in addition, DRAM memory cells, MRAM memory cells, PCRAM memory cells and others. In other words, the memory cells may be any kind of information storing device which may be arranged in an arbitrary manner.

Figure 2A:
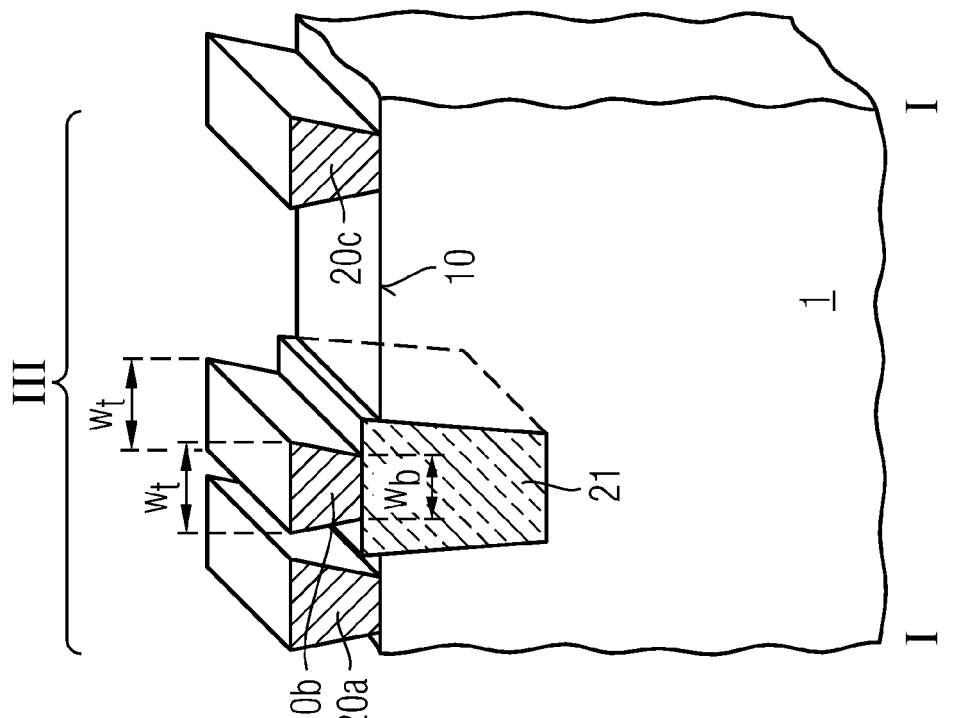
FIGS. 2A and 2B illustrate cross-sectional views of portions of the memory device.

FIG. 2 illustrates cross-sectional views of portions of a memory device which may be, for example, the memory device illustrated in FIG. 1. The cross-sectional view of FIG. 2A is taken in the peripheral portion 13 of such a memory device. The position of the cross-sectional view between I and I can be taken from FIG. 1. As can be seen from the illustrated cross-sectional view, conductive lines 20a, 20b, 20c are arranged on the surface of the semiconductor carrier 1. For example, the semiconductor carrier 1 may be a monocrystalline semiconductor wafer, for example, a silicon wafer. The semiconductor carrier as well may include any other kind of suitable semiconductor substrate such as a SOI substrate (silicon on insulator). Doped portions may be formed in the semiconductor carrier. For example, the doped portions may be formed adjacent to the substrate surface. In addition, patterned portions may be provided in the surface portion of the semiconductor carrier. For example, isolation trenches 21 which are filled with an insulating material, such as silicon oxide, may be formed in the surface of the semiconductor carrier. As can be seen from FIG. 2A, portions of the conductive lines 20a, 20c, adjoin the surface of the semiconductor carrier. In this respect, the surface of the semiconductor carrier is referred to as the surface of the carrier in which semiconductor material is present. For example, in the embodiment illustrated in FIG. 2A, the surface of the monocrystalline portions of the semiconductor carrier is to be understood as part of the surface of the semiconductor carrier. Furthermore, the conductive line 20b may adjoin a surface of the isolation trench 21 which is filled with an insulating material.

Figure 2B:
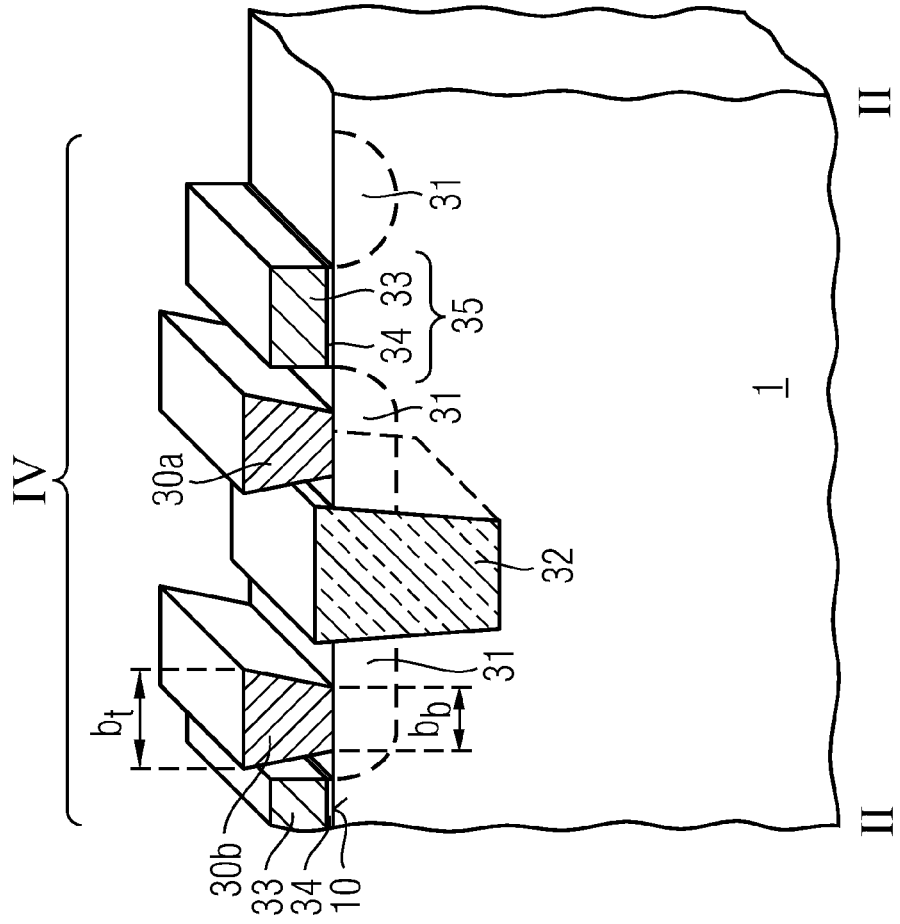

FIG. 2B illustrates a cross-sectional view of an array portion. For example, memory cells may be disposed in the array portion between II and II. In addition, the array portion may include source lines 30a, 30b which are connected with selected ones of the memory cells 35. As can be seen, the source lines adjoin the surface of the semiconductor carrier 1. As can be seen from FIGS. 2A and 2B, the conductive lines 20a, 20b and 20c as well as the source lines 30a, 30b may be formed in such a manner that the top surfaces are disposed at the same height. For example, a line width of each of the conductive lines 20a, 20b, 20c may be larger in a top portion than in a bottom portion thereof. As is illustrated in FIG. 2A, $W_t$ may be larger than $W_b$. Likewise, a line width of each of the source lines 30a, 30b may be larger in a top portion than in a bottom portion thereof. As is illustrated in FIG. 2B, $b_t$ may be larger than $b_b$. The line width is measured in a direction perpendicular with respect to the direction in which the corresponding conductive line or source line extends. By way of example, the source lines 30a, 30b may be formed so as to be in contact with the doped portions 31 which form part of a transistor including the gate electrode 33 and the gate dielectric 34. By way of example, portions of the substrate may be isolated by the isolation trenches 32.

As can further be seen from FIGS. 2A and 2B, the source lines 30a, 30b of the array portion and the conductive lines 20a, 20b and 20c of the peripheral portion may be formed in a first conductive layer of the memory device.

As will be explained with reference to FIG. 2C, the conductive lines 20a, 20b, 20c in the peripheral portion as well as the source lines 30a, 30b in the array portion may be at least partially provided by common processes, for example by simultaneous processes. For example, a memory device having a memory cell array as illustrated in FIG. 2A, for example, as well as a peripheral portion as illustrated in FIG. 2B, may be formed by defining an array portion including memory cells and a peripheral portion in a semiconductor carrier (S1). Thereafter, conductive lines are provided in the peripheral portion, the conductive lines adjoining the semiconductor carrier, and source lines are provided in the array portion. For example, the source lines and the conductive lines may be at least partially provided by common or simultaneous processes (S2a and S2b). Thereafter, the peripheral portion as well as the array portion will be further processed, for example, by performing common and single processing steps, respectively (S3). As is illustrated in FIG. 2D, by way of example, the conductive lines in the peripheral portion and the source lines in the array portion may be formed by a damascene process. According to this damascene process, first, a dielectric layer such as a silicon oxide layer is provided on the surface of the semiconductor carrier so as to cover the peripheral portion as well as the array portion (S4). Thereafter, the dielectric layer is patterned in a suitable manner so as to define trenches corresponding to the source lines in the array portion and trenches corresponding to the conductive lines in the peripheral portion (S5A, S5B). Thereafter, a conductive material is deposited so as to fill the trenches etched into the dielectric layer. Thereafter, a CMP (chemical mechanical polishing) or a back-etching process is performed so as to remove the conductive material from the surface of the dielectric layer (S6). As a result, the lines etched in the dielectric material are filled with a conductive material. As a consequence, conductive lines 20a are defined in the peripheral portion, and source lines are defined in the array portion. Thereafter, further processes for further processing the memory cell portion as well as the peripheral portion are performed (S3).

Figure 3A:
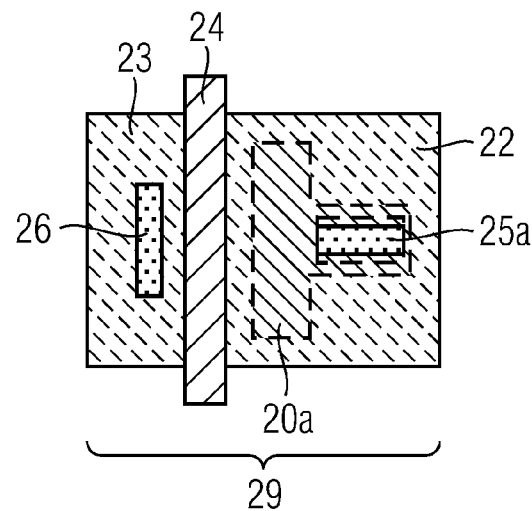
FIGS. 3A to 3C illustrate exemplary plan views of exemplary transistors, respectively.

By way of example, the conductive lines, which are present in the peripheral portion may be used for contacting a doped portion of a transistor. As is illustrated in FIG. 3A, for example, a transistor 29 which is disposed in the peripheral portion of the memory device may include a first doped portion 22 (first source or drain portion), a second doped portion 23 (second source or drain portion) and a gate electrode 24. The gate electrode 24 is adapted to control an electrical current flow from the first doped portion 22 to the second doped portion 23. By way of example, an electrical contact from the first doped portion 22 to a higher metallization or conductive layer may be accomplished via a peripheral contact 25. Such a peripheral contact 25 may be adjacent to the higher metallization or conductive layer and the conductive line 20a that is adjoining the doped portion of the transistor 29. Accordingly, the peripheral contact 25a forms a contact plug which is in contact with a top side of the conductive line. The contact plug is configured to connect the conductive line with a higher conductive layer. As is illustrated in FIG. 3A, the second doped portion 23 may be connected to a suitable conductive line by a direct contact 26.

Figure 3B:
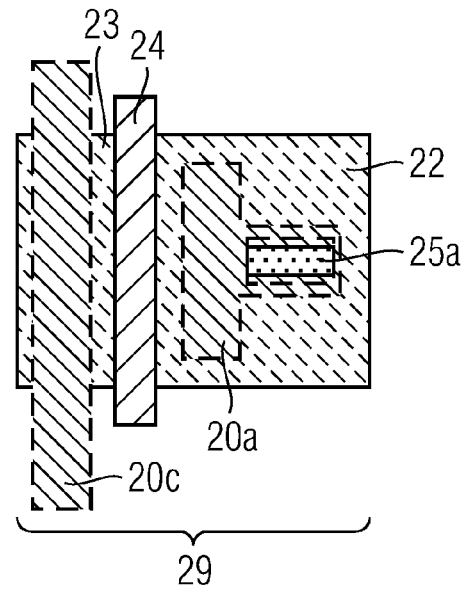
Figure 3C:
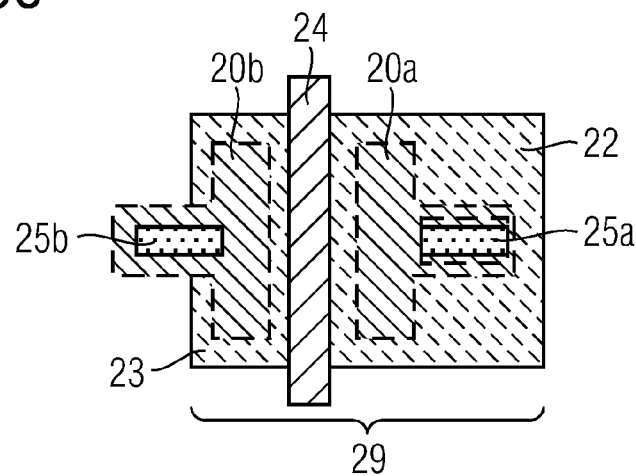

As is illustrated in FIG. 3B, the second doped portion 23 may as well be connected via a further conductive line 20c with a suitable conductive line. Moreover, as is illustrated in FIG. 3C, the second doped portion 23 may be connected with a further conductive line 20b. The further conductive line 20b may be connected via a contact plug with a higher conductive layer. As can be taken from FIGS. 3A to 3C, the conductive lines 20a, 20b, 20c are disposed so that the whole width of the transistor can be connected by the conductive line. As a consequence a contact of the first doped portion 22 and, optionally, the second doped portion 23 can be formed over the whole width of the first doped portion 22 and, optionally, the second doped portion 23, respectively. Accordingly, the homogeneity of current flow in the transistor is improved. Moreover, the contact area between the conductive line and the first doped portion and, optionally, the second doped portion is increased. As a consequence, the contact resistance is reduced.

Figure 4A:
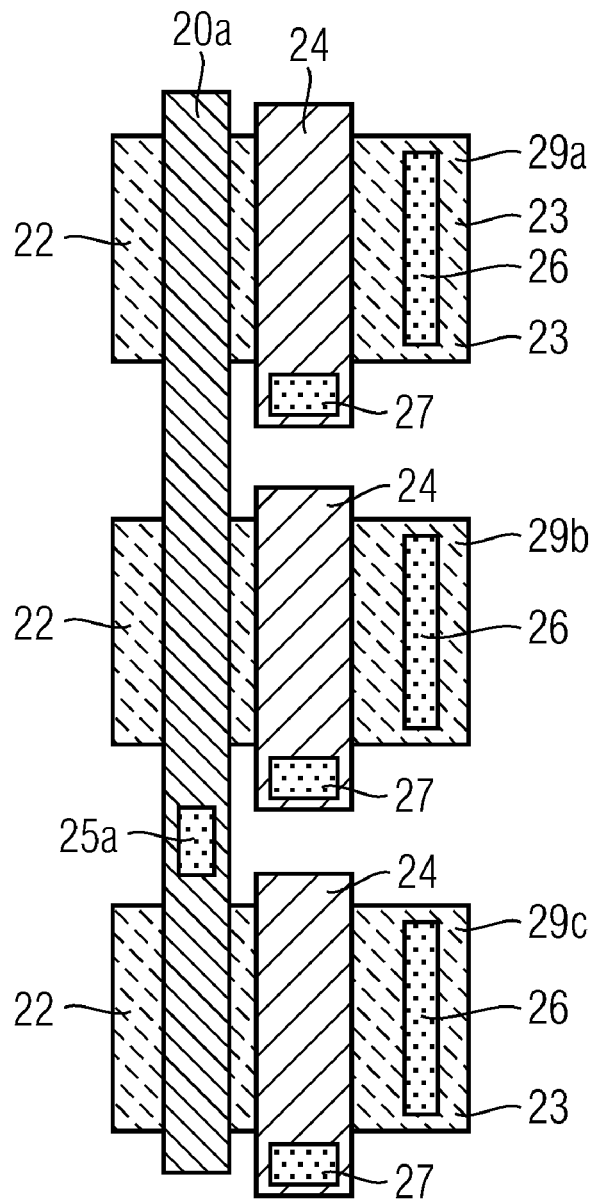

For example, the conductive lines may be used for providing a connection of devices such as transistors to a higher conductive layer. Nevertheless, such a conductive line can as well be provided so as to locally interconnect specific devices. By way of example, as is illustrated in FIG. 4A, the conductive line 20a may be used for connecting the transistors 29a, 29b, 29c with each other. Moreover, the first doped portions 22 of the transistors 29a, 29b and 29c may be connected with a higher conductive layer via the peripheral contact 25a.

Figure 4B:
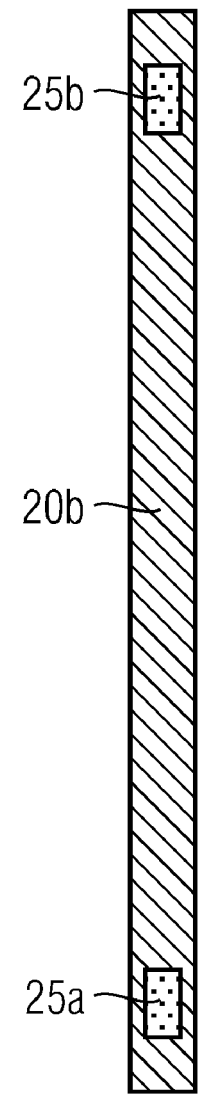

The conductive lines 20a, b, c may be formed in an arbitrary manner. For example, they may be formed as straight lines as is illustrated in FIGS. 4A, 4B, extending in one single direction. As is illustrated in FIG. 4B, for example, two peripheral contacts may be provided so as to accomplish a contact of the conductive line 20b with appropriate lines. For example, the line 20b may be disposed so as not to connect any active area. In more detail, the line 20b may adjoin the surface of the insulating material being present in an isolation trench. For example, the line 20b may by-pass a portion of another conductive line. As is illustrated in FIG. 4B, two contacts 25a, 25b may be in contact with the conductive line 20b so as to connect the conductive line 20b with the other conductive line. Furthermore, the conductive lines may be angled lines extending in more than one direction. Accordingly any arbitrary interconnection scheme may be accomplished.

For example, as is illustrated in FIG. 4C, several transistors may be connected by the conductive lines 20a, 20b and 20c. Although in FIG. 4C several transistors are illustrated, it is clearly to be understood that any other kind of devices or components may be connected by the conductive lines 20a, b, c.

Figure 5:
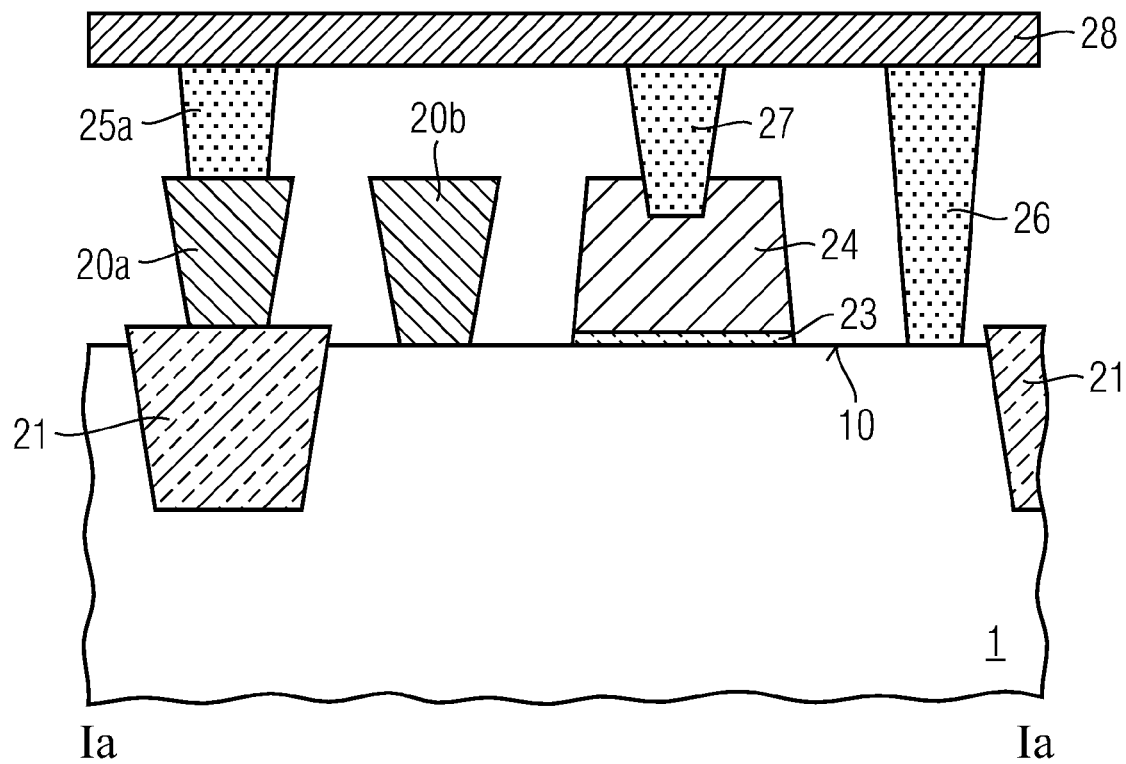
FIG. 5 illustrates an exemplary cross-sectional view of a portion of a memory device.

FIG. 5 illustrates an exemplary cross-sectional view of a peripheral portion between Ia and Ia as can be taken from FIG. 1, for example. As can be seen, a conductive line 20b is provided so as to be directly adjacent to the surface 10 of the semiconductor carrier or substrate 1. As is illustrated, the line 20b is in physical contact with the surface 10. Although the line 20a is disposed above the isolation trench 21, portions of the line 20a may be directly adjacent to the surface 10 of the semiconductor carrier 1. Nevertheless, the line 20a may as well be only adjacent to the surface of the insulating material of the isolation trench 21. For example, in a cross-sectional view which lies before or behind the depicted plane of the drawing, the line 20a may be in direct physical contact with the surface 10. The line 20a is connected with a higher metallization layer 28 via the peripheral contact 25a. By way of example, the metallization layer 28 may be the M0 metallization layer. For example, this metallization layer 28 may be disposed at the same height as the array of bitlines which is disposed in the array portion of the memory device. Furthermore, for example, gate electrodes 24 may be formed over the substrate surface 10, a gate dielectric 23 being disposed between the gate electrode 24 and the surface 10. The gate electrode 24 may be connected with the higher metallization layer 28 via a gate contact 27. Moreover, direct contacts 26 between the metallization layer 28 and the carrier surface 10 may be provided. In addition, isolation trenches 21 which are filled with an insulating material may be disposed in the surface region of the semiconductor carrier 1. As can be seen, in the conductive layer in which the conductive lines 20a, 20b are present, further contact plugs, for example, direct contacts 26 may be present. Accordingly, the bottom side of the direct contact 26 is disposed at the same height as the bottom side of the conductive line 20b that adjoins the surface of the semiconductor carrier.

Figure 6A:
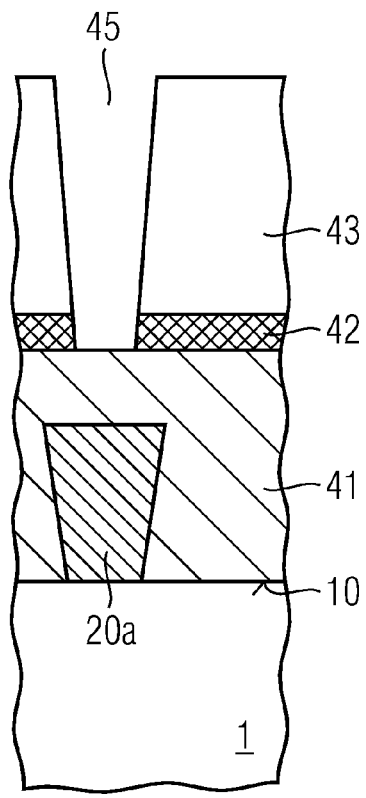
FIGS. 6A to 6C illustrate exemplary cross-sectional views of a substrate after performing processing steps.
Figure 6B:
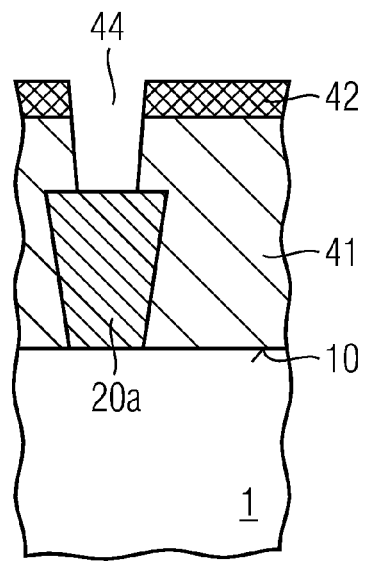
Figure 6C:
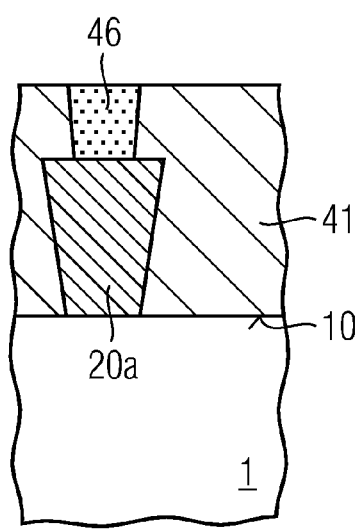

FIG. 6C illustrates a further exemplary cross-sectional view of a portion of a memory device. As can be seen, the conductive layer 20 is in direct contact with the surface 10 of the semiconductor carrier 1. A dielectric material 41 is provided adjacent to the conductive line 20a. As can further be seen, a contact plug 46 is formed so as to be in physical contact with the conductive line 20a. As will be explained hereinafter, the use of the conductive line 20a may be provide conductive contacts through the dielectric material 41.

As is illustrated with reference to FIG. 6A, for forming a contact through the layer 41, the conductive layer 20a is provided on top of the surface 10 of the semiconductor carrier 1. A dielectric layer 41 is provided. In addition, suitable hard masks 42 and a suitable photoresist layer 43 are provided on top of the dielectric layer 41. In a usual manner, a resist opening 45 may be formed by a suitable photolithographic method. After transferring the photoresist opening 45 into the hard mask material 42 the photoresist material 43 is removed from the surface of the hard mask layer 42. Taking the resist opening 45 as an etching mask, a contact opening 44 is formed in the dielectric material 41. After removing the hard mask layer 42, a conductive material is filled into the contact openings so as to form a contact plug 46. As becomes apparent from the above, due to the presence of the conductive layer 20a, the contact opening 44 need not to be etched to such a large depth. Accordingly, the method of manufacturing the contact plug 46 is greatly simplified.

Figure 6D:
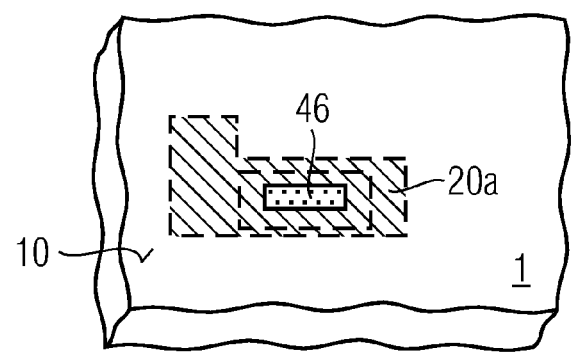
FIG. 6D illustrates a plan view of a portion of an exemplary memory device.

FIG. 6D illustrates a plan view on the resulting contact plug 46 which is formed above the conductive layer 20a. Depending on the requirements of the whole device, the conductive layer 20a may be patterned so as to have an arbitrary shape.

Figure 7A:
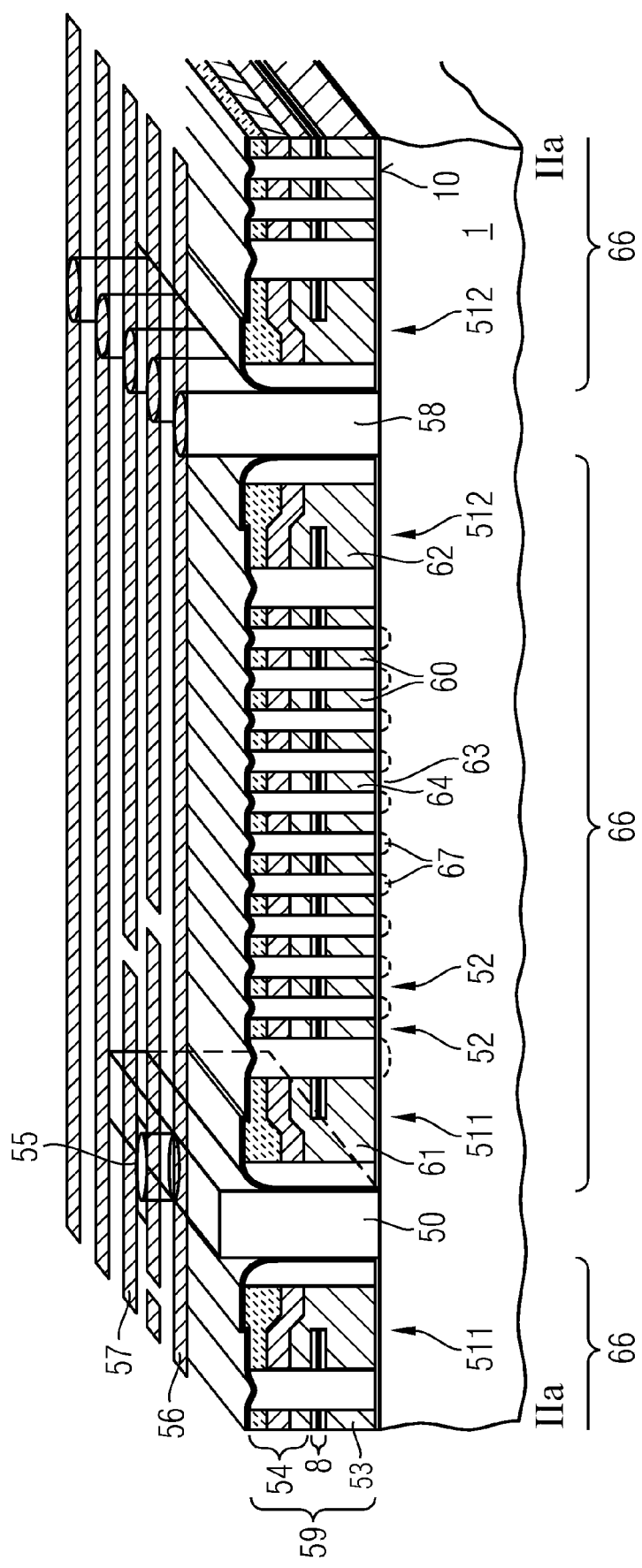
FIG. 7A illustrates an exemplary cross-sectional view of a further memory device.

FIG. 7A illustrates schematically an exemplary cross-sectional view of an array portion. In the illustrated embodiment, the memory cells may be implemented as storage transistors 52. Each of the storage transistors 52 includes doped portions 67. A channel 63 is formed between each of the doped portions 67. The conductivity of the channel is controlled by a corresponding gate electrode 64. The gate electrode 64 is made of a gate stack 59. In the illustrated embodiment, the gate stack 59 may include a charge storing layer 53 which may be made of polysilicon. A control gate portion 54 is provided above the charge storing layer 53. The control gate 54 is insulated from the charge storing layer 53 by the barrier layer stack which may include a silicon oxide layer, followed by silicon nitride layer, followed by silicon oxide layer. As can be seen from FIG. 7A, a plurality of storage transistors 52 are connected in series, thereby forming a NAND-string. A selected NAND-string may be addressed by addressing a common source line 50, activating a corresponding first select transistor 511 and reading the signal via a bitline contact 58.

To be more specific, the select transistor 511 may be addressed by the first select gate 61. The common source line 50 is directly adjacent to the substrate surface 1. Accordingly, the source line 50 is in physical contact with the surface 10. The common source line 50 may be connected via the source line contact 55 with higher metallization layers. The signal is transmitted via a bitline contact 58 to a corresponding bitline 56 which may be disposed in the M0 metallization layer. In addition, further interconnection lines 57 may form part of this metallization layer. In the conductive layer in which the source line 50 is present, further contact plugs, for example the bitline contacts 58 are present. Accordingly, the bottom side of the bitline contact 58 is disposed at the same height as the bottom side of the common source line 50.

FIG. 7B illustrates an exemplary plan view of a memory cell array having NAND-strings such as those which are illustrated in FIG. 7A, for example. As is illustrated, a plurality of bitlines 56 as well as a plurality of wordlines 60 are formed so as to perpendicularly intersect each other. NAND-strings 66 may be formed so as to extend parallel with respect to the direction of the bitlines 56. The common source line 50 is connected with the source portions of each of the first select transistors 511. The first select transistors are controlled by the first select gate line 611. The first select gate line 611 is connected with the first select gate 61 of the first select transistors, respectively. Furthermore, the drain portions of each of the second select transistors 512 are connected with a corresponding bitline 56 via a bitline contact 58.

Figure 8A:
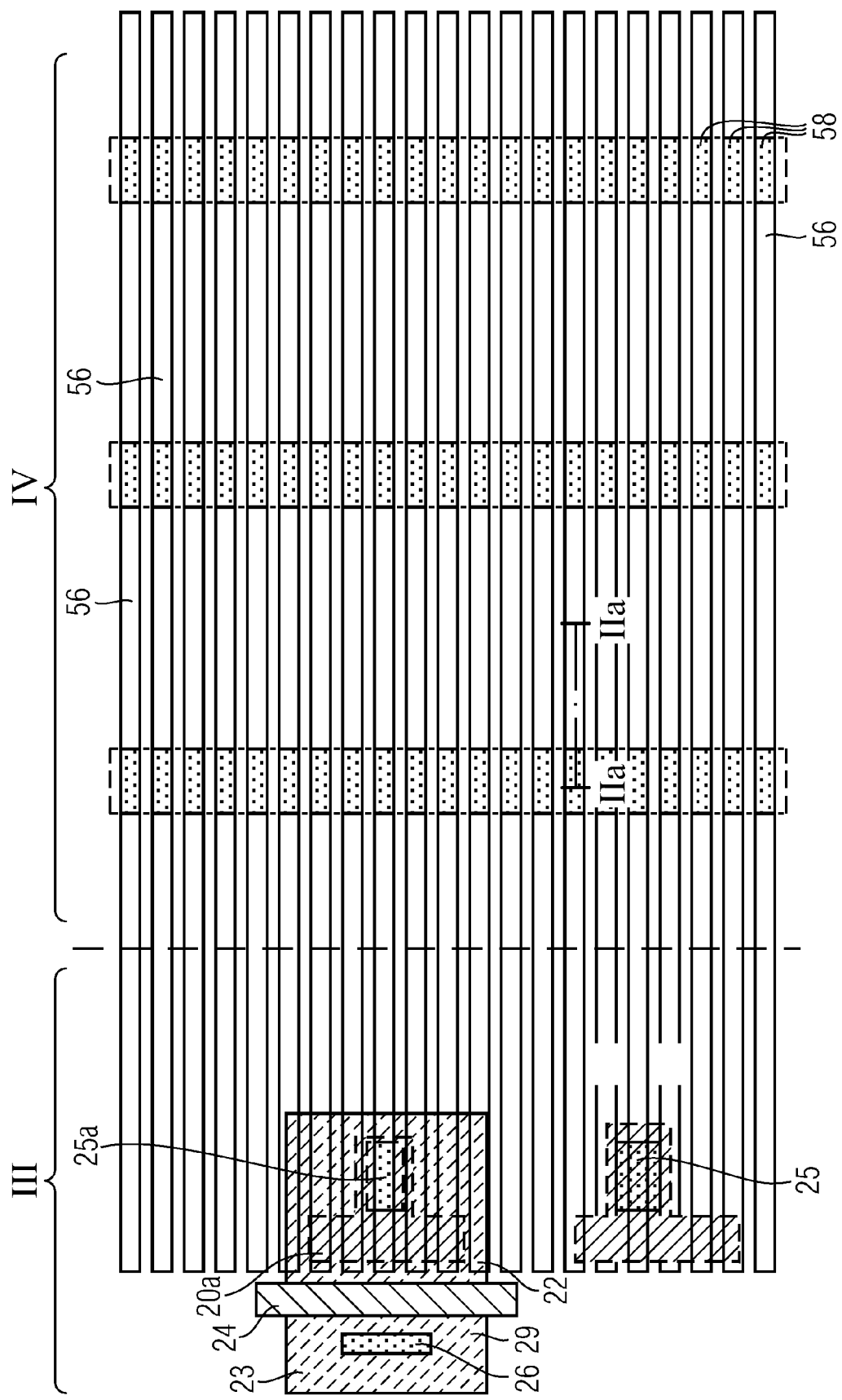
Figure 8C:
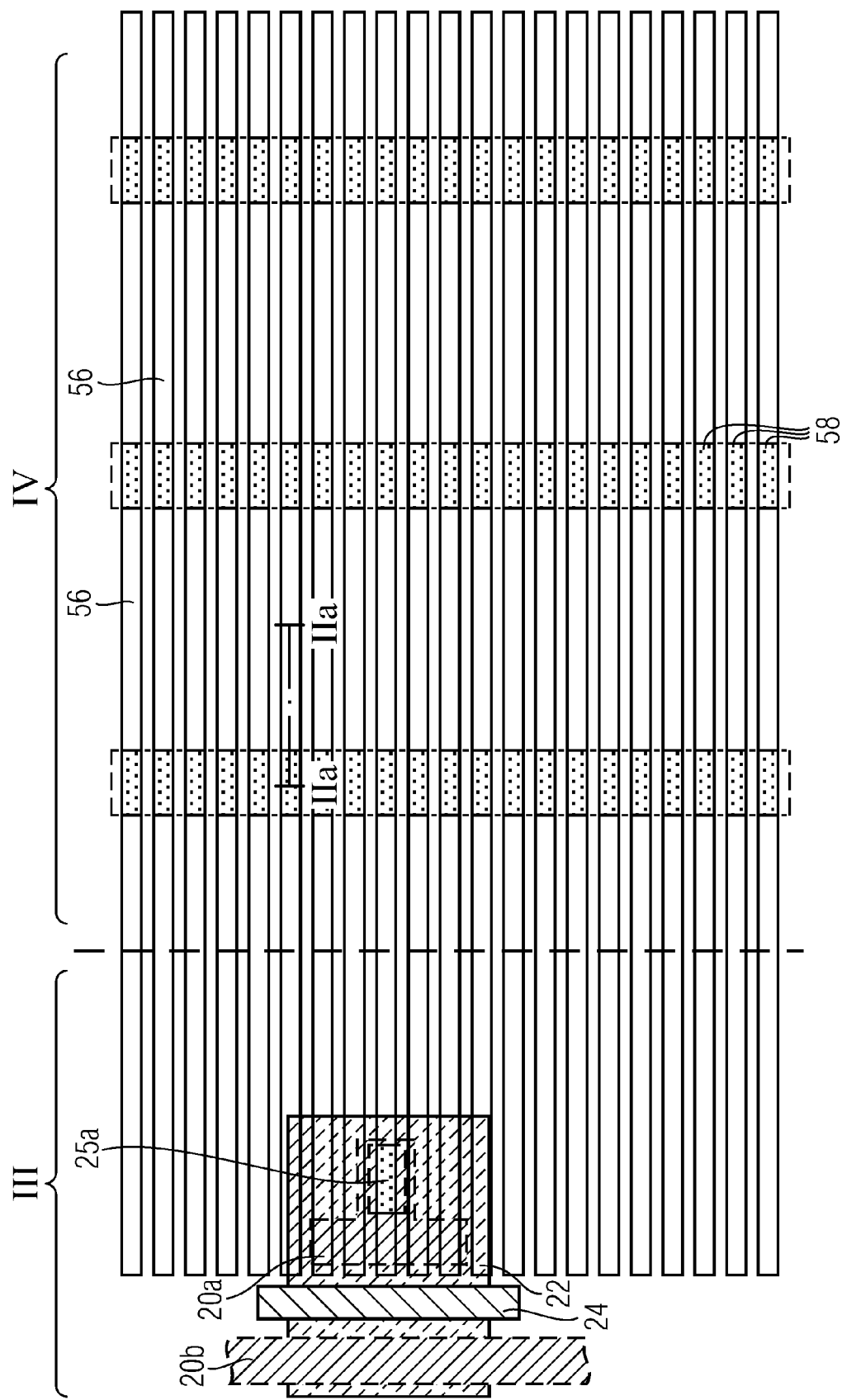

In the embodiments illustrated in FIGS. 8A, 8B and 8C, the array portion includes conductive array lines (bitlines 56) which are disposed in a higher conductive layer. For example, as can be taken from the cross-sectional view of FIG. 7A, the bitlines 56 may be disposed in the M0 metallization layer. Furthermore, the bitlines 56 are connected with the conductive lines 20a of the peripheral portion. Accordingly, it becomes possible to connect devices of the peripheral portion, the devices having a large lateral extension, with bitlines 56 which are arranged at a very small pitch. Referring to FIG. 8A, the bitlines 56 of the array portion may extend to the fan-out portion of the memory device. In the fan-out portion III the bitlines 56 may be connected with peripheral transistors 29. For example, as is illustrated in FIG. 8A, the contact of a selected bitline 56 with the peripheral transistor 29 may be accomplished so that a peripheral contact 25a is provided which connects the bitline 56 with the conductive line 20a. As has been described above, with reference to FIG. 3A, the conductive line 20a may adjoin the source portion of the transistor 29. Accordingly, in the manner which has been described above, the transistor 29 is connected with a higher metallization layer. For example, this higher metallization layer may be a corresponding bitline 56. In the array portion IV, a plurality of NAND-strings which have been explained with reference to FIG. 7A, may be disposed, bitline contacts 58 being provided so as to accomplish a contact between the NAND-string and a corresponding bitline.

FIG. 8B illustrates in a similar manner a contact of a peripheral transistor with a corresponding bitline 56. In the example illustrated in FIG. 8B, the transistor may be implemented in the manner as has been described above with reference to FIG. 3C. Moreover, as is illustrated in FIG. 8C, the transistor of the type which has been described above with reference to FIG. 3B may be connected with a corresponding bitline 56 which is disposed in a higher metallization layer. Since the transistors illustrated in FIGS. 8A to 8C essentially correspond to the transistors illustrated in FIGS. 3A, 3C and 3B, respectively, a detailed description thereof is omitted, for the sake of convenience. The peripheral contacts 25a may be formed in an arbitrary manner. For example, they may be formed in the manner as is illustrated in the upper portion of FIG. 8A, or as it is illustrated in FIG. 8B or 8C. Nevertheless, they may as well be formed in the manner illustrated in the lower portion of FIG. 8A. As can be seen, a peripheral contact 25 may have a width w, which is larger than the array pitch p. By way of example, an electrical short-circuit may be avoided by interrupting the adjacent bitlines.

FIG. 9 illustrates a further embodiment of the present invention. As can be seen, the memory device includes an array portion IV as well as a peripheral portion III. As can be seen, in the array portion, a plurality of NAND-strings 661 of the manner as has been explained with reference to FIG. 7A are disposed. Nevertheless, in contrast to the embodiment illustrated in FIG. 7A, in the embodiment illustrated in FIG. 9, the common source line is not directly adjacent to the substrate surface 10. The common source line is disposed in the first conductive layer, for example, the first metallization layer. Source line contacts 73 are provided for accomplishing a contact between the common source line 70 and the corresponding NAND-strings. By way of example, the common source line 70 may be disposed in the layer in which also the bitlines 56 are present. As can be seen from the left hand portion of FIG. 9, in the peripheral portion, also a conductive line 71 may be provided which is disposed in the first metallization or conductive layer of the memory device. The conductive line 71 is connected with selected portions of the substrate surface 10 via contact plugs 72.

Figure 10A:
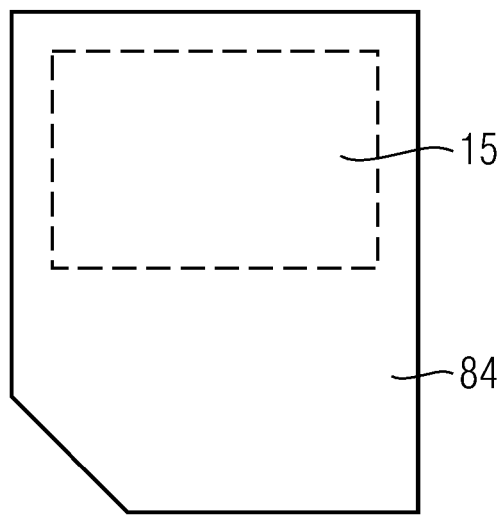
FIG. 10A illustrates an exemplary memory card incorporating a memory device according to an embodiment.
Figure 10B:
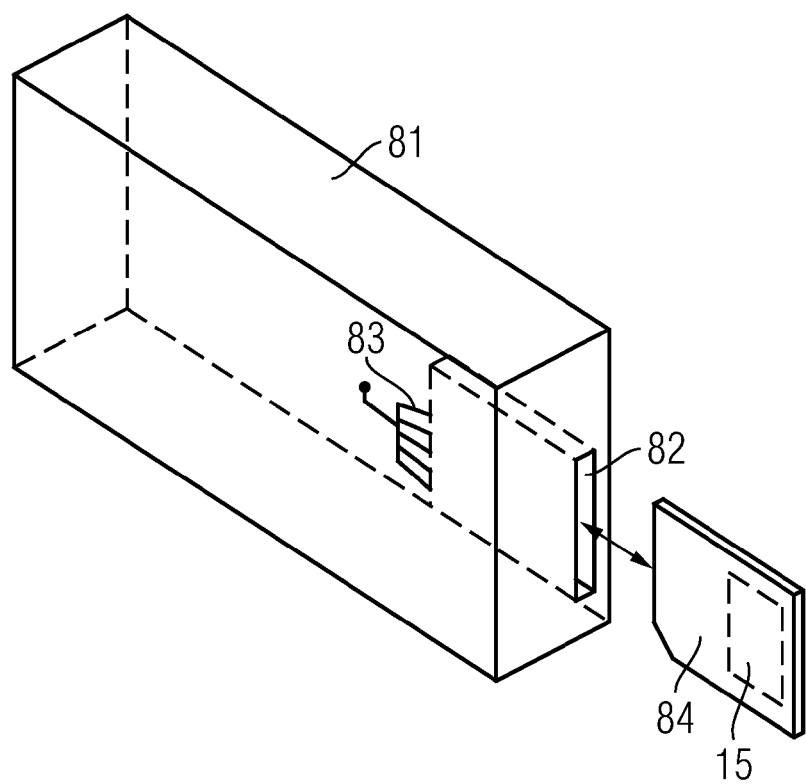
FIG. 10B illustrates an exemplary electric device that may incorporate the memory card illustrated in FIG. 10A.

FIG. 10A illustrates an exemplary memory card 84 incorporating a memory device 15 according to an embodiment. The memory card 84 illustrated in FIG. 10A can be used in any type of electric device. For example, FIG. 10B illustrates an exemplary electric device 81 that may incorporate the memory card 84 illustrated in FIG. 10A. The electric device includes a card interface 83, a card slot 82 connected to the card interface 83 and a memory card 84 having a memory device 15, which has been explained above. The electric device 81 may be any kind of electrical device, for example, a portable electric device or any other kind of electric device. For example, the electric device may be a digital still camera or a video camera, a game apparatus, an electric music instrument, a cell phone, a personal computer, a notebook, a personal digital assistant (PDA) or a PC-card. The electric device 81 may, of course, include further components such as processing devices, display devices, further memory devices and others.

Moreover, the electric device also includes a device in which the memory card is fixedly housed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A non-volatile semiconductor memory device comprising:
   a memory cell array comprising NAND strings, wherein each NAND string comprises non-volatile memory transistors connected in series;
   a source line, configured to be connected with the NAND string array via select transistors; and a peripheral portion including conductive lines, portions of the conductive lines adjoining a surface of a semiconductor carrier.

2. The non-volatile semiconductor memory device of claim 1, comprising wherein portions of the source line are adjoining the surface of the semiconductor carrier.

3. A non-volatile semiconductor memory device comprising:
   a memory cell array comprising NAND strings, wherein each NAND string comprises non-volatile memory transistors connected in series;
   a source line, configured to be connected with the NAND string array via select transistors; and
   a peripheral portion including conductive lines,
   wherein the conductive lines and the source line are disposed in a first conductive layer.

4. The non-volatile semiconductor memory device of claim 3, comprising wherein portions of the source lines adjoin a surface of a semiconductor carrier.

5. The non-volatile semiconductor memory device of claim 3, comprising wherein the peripheral portion further includes transistors, each of the transistors comprising a doped portion, and the conductive lines are configured to connect the doped portions of selected ones of the transistors.

6. The non-volatile semiconductor memory device of claim 3, wherein the peripheral portion further comprises contact plugs made of a conductive material in contact with a top side of the conductive lines.

7. The non-volatile semiconductor memory device of claim 3, wherein the array portion further comprises conductive array lines which are disposed in a higher conductive layer, the conductive array lines being connected with the conductive lines of the peripheral portion.

8. The non-volatile semiconductor memory device of claim 3, comprising wherein a top diameter of the conductive lines is larger than a bottom diameter of the conductive lines and wherein a top diameter of the source lines is larger than a bottom diameter of the source lines.

9. A memory device comprising:
   an array portion including memory cells; and
   a peripheral portion including isolation trenches disposed in a surface region of a semiconductor carrier, the isolation trenches being filled with an insulating material, and conductive lines, wherein a top diameter of the conductive lines is larger than a bottom diameter of the conductive lines and wherein portions of the conductive lines adjoin a surface of the isolation trenches.

10. The memory device of claim 9, wherein the peripheral portion further comprises contact plugs made of a conductive material in contact with a top side of the conductive lines.

11. A memory device comprising:
    an array portion including memory cells; and
    a peripheral portion including conductive lines, portions of the conductive lines adjoining a surface of a semiconductor carrier,
    wherein the array portion further includes source lines connected with selected ones of the memory cells, the source lines adjoining the surface of the semiconductor carrier.

12. A memory device comprising:
    an array portion including memory cells; and
    a peripheral portion including conductive lines, portions of the conductive lines adjoining a surface of a semiconductor carrier,
    wherein the devices comprise transistors, each of the transistors comprising a doped portion, and the conductive lines are configured to connect doped portions of selected transistors.

13. A memory device comprising:
    an array portion including memory cells; and
    a peripheral portion including conductive lines, portions of the conductive lines adjoining a surface of a semiconductor carrier,
    wherein the peripheral portion further comprises contact plugs made of a conductive material in contact with a top side of the conductive lines.

14. A memory device comprising:
    an array portion including memory cells; and
    a peripheral portion including conductive lines, portions of the conductive lines adjoining a surface of a semiconductor carrier,
    wherein contact plugs made of a conductive material are present in the layer of the conductive lines.

15. A memory device comprising:
    an array portion including memory cells; and
    a peripheral portion including conductive lines, portions of the conductive lines adjoining a surface of a semiconductor carrier,
    wherein a top diameter of the conductive lines is larger than a bottom diameter of the conductive lines.

16. A memory device comprising:
    an array portion including memory cells and source lines in contact with selected ones of the memory cells, the source lines adjoining a surface of a semiconductor carrier; and
    a peripheral portion including conductive lines, portions of the conductive lines adjoining the surface of the semiconductor carrier.

17. The memory device of claim 16, wherein the array portion further comprises conductive array lines which are disposed in a higher conductive layer, the conductive array lines being connected with the conductive lines of the peripheral portion.

18. The memory device of claim 16, comprising wherein a top diameter of the conductive lines is larger than a bottom diameter of the conductive lines and wherein a top diameter of the source lines is larger than a bottom diameter of the source lines.

19. A memory card including a non-volatile semiconductor memory device comprising:
    a memory cell array comprising NAND strings, wherein each NAND string comprises non-volatile memory transistors connected in series;
    a source line, configured to be connected with the NAND string array via select transistors; and
    a peripheral portion including conductive lines, portions of the conductive lines adjoining a surface of a semiconductor carrier.

20. An electric device comprising:
    a card interface;
    a card slot connected to the card interface; and
    a memory card including a non-volatile semiconductor memory device comprising:
    a memory cell array comprising NAND strings, wherein each NAND string comprises non-volatile memory transistors connected in series;
    a source line, configured to be connected with the NAND string array via select transistors;
    a peripheral portion including conductive lines, portions of the conductive lines adjoining a surface of a semiconductor carrier; and
    the memory card being configured to be connected and removed from the card slot.

* * * * *